United States Patent
Lin et al.

(10) Patent No.: US 8,644,087 B2
(45) Date of Patent: Feb. 4, 2014

(54) LEAKAGE-AWARE KEEPER FOR SEMICONDUCTOR MEMORY

(75) Inventors: Jihi-Yu Lin, Taichung (TW); Li-Wen Wang, Taichung (TW); Wei Min Chan, Sindian (TW); Yen-Huei Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 256 days.

(21) Appl. No.: 13/177,711

(22) Filed: Jul. 7, 2011

(65) Prior Publication Data

US 2013/0010544 A1 Jan. 10, 2013

(51) Int. Cl.
*G11C 7/10* (2006.01)

(52) U.S. Cl.
USPC ...... 365/189.05; 365/191; 365/203; 365/205; 365/226

(58) Field of Classification Search
USPC .................. 365/189.05, 191, 203, 205, 226
See application file for complete search history.

(56) References Cited

U.S. PATENT DOCUMENTS

| 7,535,776 | B1 | 5/2009 | Behrends et al. |
| 7,619,923 | B2 * | 11/2009 | Correale et al. ......... 365/185.13 |
| 2010/0214860 | A1 | 8/2010 | Upputuri |
| 2011/0273945 | A1 * | 11/2011 | Donkoh ....................... 365/191 |

* cited by examiner

*Primary Examiner* — Toan Le
(74) *Attorney, Agent, or Firm* — Duane Morris LLP

(57) ABSTRACT

A circuit includes a first circuit configured to sense a leakage of a first bit line and output a first signal in response, and a second circuit configured to receive the first signal output from the first circuit and in response supply current to a second bit line for maintaining a voltage level of the second bit line.

20 Claims, 5 Drawing Sheets

LEAKAGE-AWARE KEEPER FOR SEMICONDUCTOR MEMORY

FIELD OF DISCLOSURE

The disclosed system and method relate to semiconductor memories. More specifically, the disclosed system and method relate to reducing pull-up DC leakage current from a keeper and reducing power consumption in semiconductor memories.

BACKGROUND

Static random access memories ("SRAM") include a plurality of cells disposed in rows and columns to form an array. Conventional SRAM cells include a plurality of transistors coupled to bit lines and word lines that are used to read and write a bit of data to the memory cell. Some conventional SRAMs include a keeper circuit for assistance during read operations. However, these conventional keeper circuits may have high DC leakage currents, especially during low voltage operation, and result in SRAM having slow operating times.

DETAILED DESCRIPTION

Figure 1A:
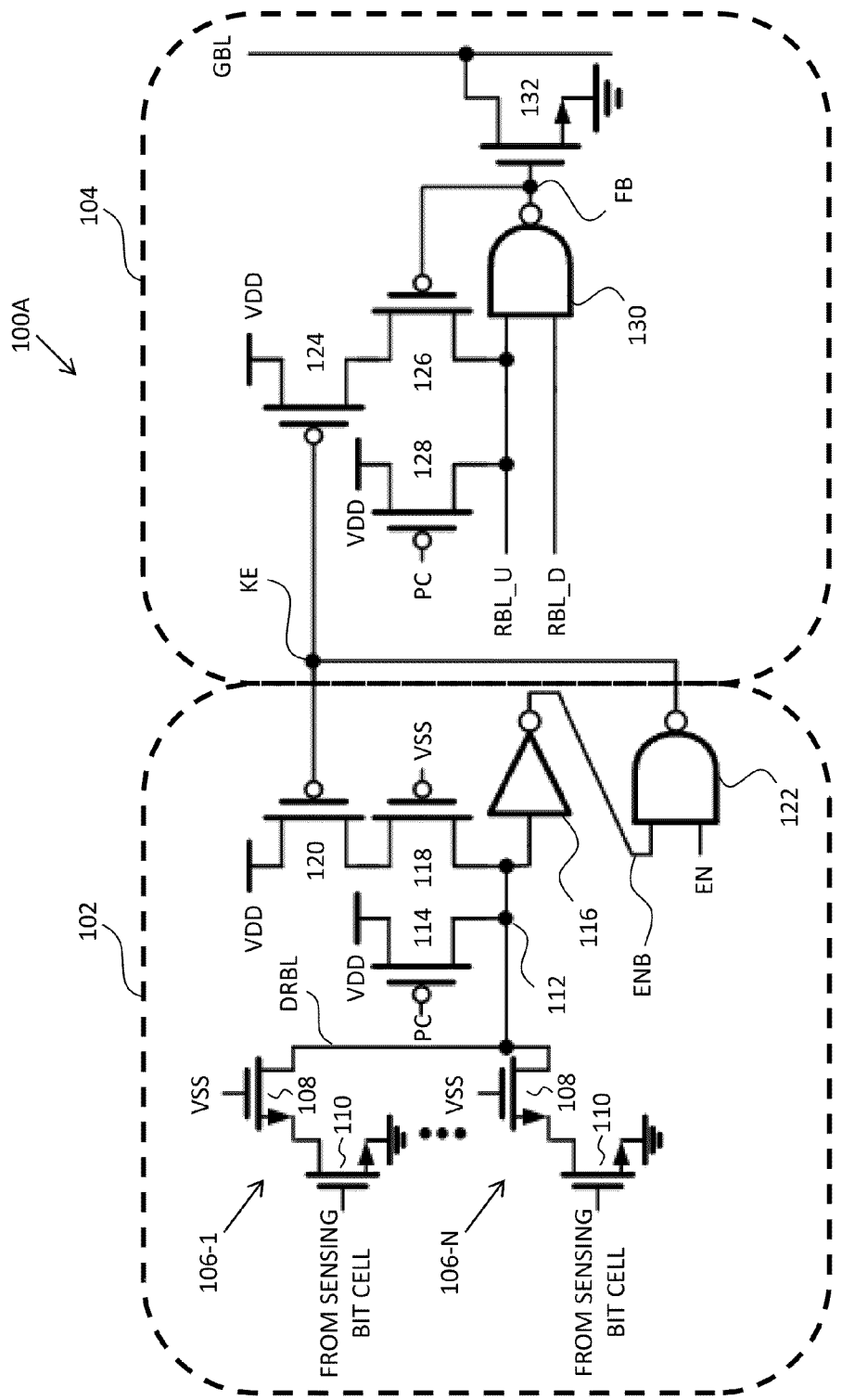
FIG. 1A is a circuit diagram of one example of an improved keeper circuit.

Improved circuits are disclosed that reduce the leakage current in semiconductor memories while at the same time improving the speed at which data is read from a bit cell in the semiconductor memory. FIG. 1A illustrates one example of an improved keeper circuit 100 including a tracking or sensing circuit 102 and an input/output ("I/O") circuit 104. Tracking circuit 102 includes one or more single-ended read ports 106-1, ..., 106-N ("read ports 106"), each comprising a pass transistor 108 and a pull-down transistor 110. Pull-down transistors 110 have their gates coupled to a detection or dummy bit cell (not shown), their sources coupled to ground or VSS, and their drains coupled to the source of pass transistors 108. Pass transistors 108 have their gates coupled to VSS, such that they are always in an 'off' or non-current-conducting state, and their drains coupled to a detecting or dummy read bit line ("DRBL").

DRBL is coupled to node 112, which is coupled to VDD through pre-charge transistor 114. Pre-charge transistor 114 has its gate coupled to a pre-charge control signal for selectively turning on and off pre-charge transistor 114 in order to pre-charge DRBL to a high voltage. Node 112 is also coupled to an input of inverter 116 and to the source of transistor 118, which has its gate coupled to low voltage supply VSS and its drain coupled to the drain of transistor 120. Transistor 120 has its source coupled to voltage supply VDD and its gate coupled to a keeper enable node, KE. KE is coupled to the output of logic gate 122, which may be implemented as a NAND gate as illustrated in FIG. 1A, and to the gate of transistor 124 of I/O circuit 104. Logic gate 122 has one input coupled to the output of inverter 116 at node ENB and a second input configured to receive an enable signal, EN, from a controller (not shown). Although a NAND gate is illustrated, one skilled in the art will understand that other logic gates, such as AND gates, OR gates, NOR gates, and XOR gates may be implemented as logic gates 122.

I/O circuit 104 includes transistor 124, which has its source coupled to voltage supply VDD and its drain coupled to the source of feedback transistor 126. Feedback transistor has its gate coupled to feedback node, FB, and its drain coupled to an up read bit line ("RBL_U"). A pull-up transistor 128 has its gate configured to receive a pre-charge control signal and its source coupled to voltage supply VDD for pre-charging RBL_U to a high voltage. Logic gate 130, which may be implemented as a NAND gate as illustrated in FIG. 1, has one input coupled to RBL_U and a second input coupled to a down read bit line ("RBL_D"). The output of logic gate 130 is coupled to node FB, which is also coupled to the gate of transistor 132. Transistor 132 has its source coupled to ground or VSS and its drain coupled to an output or global bit line ("GBL").

Figure 1B:
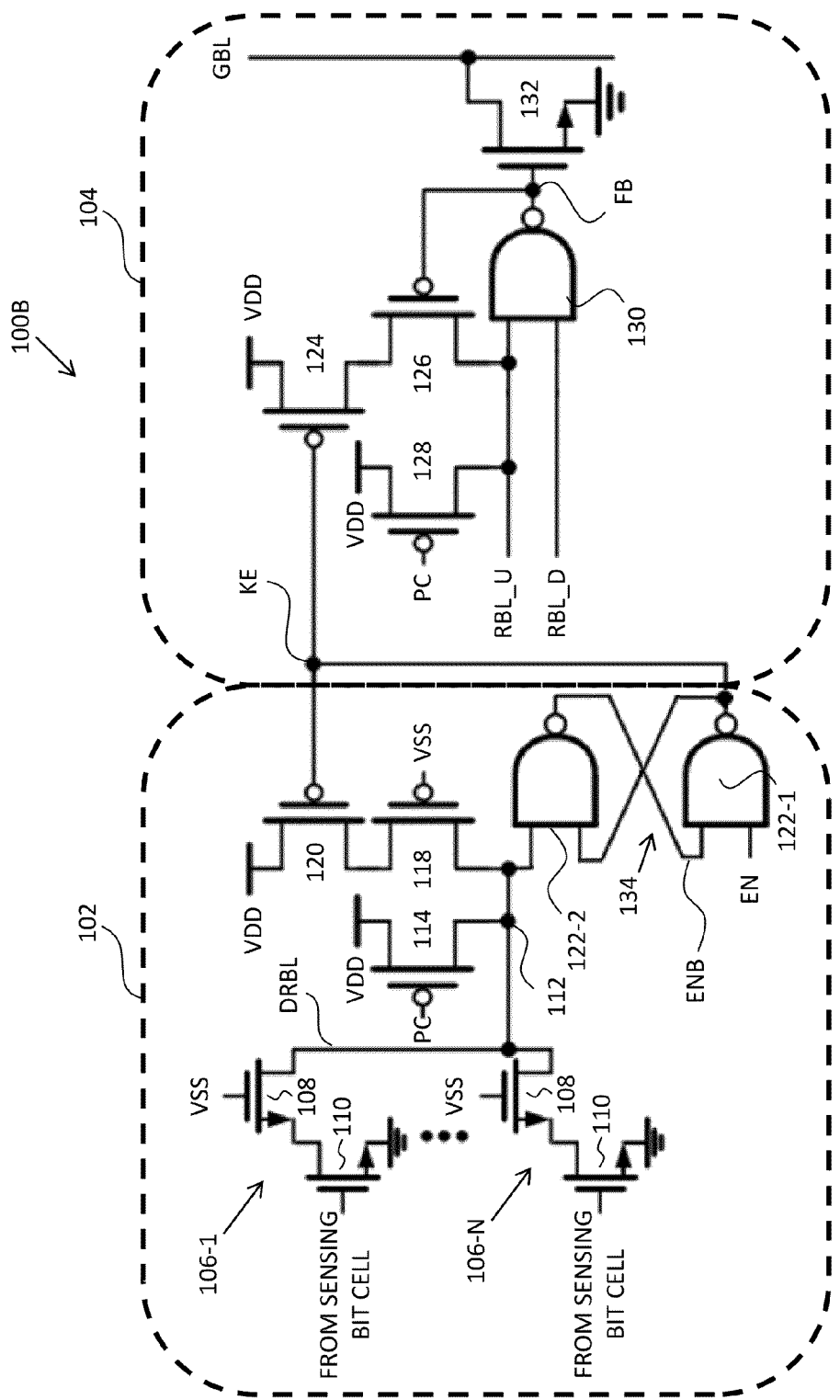
FIG. 1B is a circuit diagram of another example of an improved keeper circuit.

Another embodiment of an improved keeper circuit 100C is illustrated in FIG. 1B. Keeper circuit 100B includes tracking circuit 102 and I/O circuit 104. Tracking circuit 102 includes one or more single-ended read ports 106-1, ..., 106-N ("read ports 106"), each comprising a pass transistor 108 and a pull-down transistor 110. Pull-down transistors 110 have their gates coupled to a detecting or dummy bit cell (not shown), their sources coupled to ground or VSS, and their drains coupled to the source of pass transistors 108. Pass transistors 108 have their gates coupled to VSS, such that they are always in an off state, and their drains coupled to DRBL.

DRBL is coupled to node 112, which is coupled to VDD through pre-charge transistor 114. Pre-charge transistor 114 has its gate coupled to a pre-charge control signal for pre-charging DRBL to VDD prior to a read operation of the semiconductor memory. Node 112 is also coupled to an input of logic gate 122-2 and to the source of transistor 118, which has its gate coupled to low voltage supply VSS and its source coupled to the drain of transistor 120. Transistor 120 has its source coupled to voltage supply VDD and its gate coupled to node KE. KE is coupled to the output of logic gate 122-1, which may be implemented as a NAND gate, and to the gate of transistor 124 of I/O circuit 104.

Logic gate 122-1 is cross-coupled with logic gate 122-2, which may also be implemented as a NAND gate, to form an SR latch 134. For example, one input of logic gate 122-2 is coupled to node 112 and the other input of logic gate 122-2 is coupled to the output of logic gate 122-1. Logic gate 122-1 has one input coupled to the output of logic gate 122-2, i.e., node ENB, and the other input is configured to receive an enable signal EN from a controller (not shown). One skilled in the art will understand that the latch 134 may be implemented using other latches such as, for example, a JK flip-flop, a D flip-flop, or a T flip-flop. The output of logic gate 122-1 is also coupled to node KE.

I/O circuit 104 includes transistor 124, which has its gate coupled to node KE, its source coupled to voltage supply VDD, and its drain coupled to the source of feedback transistor 126. Feedback transistor 126 has its gate coupled to feedback node FB and its drain coupled to RBL_U. A pre-charge transistor 128 has its gate configured to receive a pre-charge control signal and its source coupled to voltage supply VDD for pre-charging RBL_U to VDD prior to a read operation. Logic gate 130, which may be implemented as a NAND gate as illustrated in FIG. 1B, has one input coupled to RBL_U and a second input coupled to RBL_D. The output of logic gate 130 is coupled to node FB, which is also coupled to the gate of transistor 132. Transistor 132 has its source coupled to ground or VSS and its gate coupled to output bit line GBL.

Figure 2:
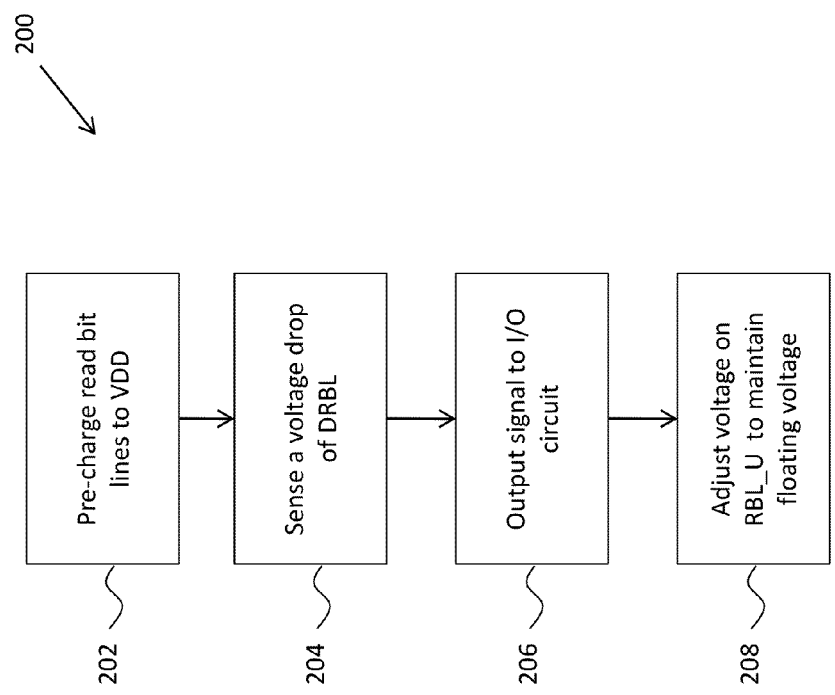
FIG. 2 is a flow diagram of a reading of a logic one performed by a keeper circuit in accordance with FIG. 1A.
Figure 3:
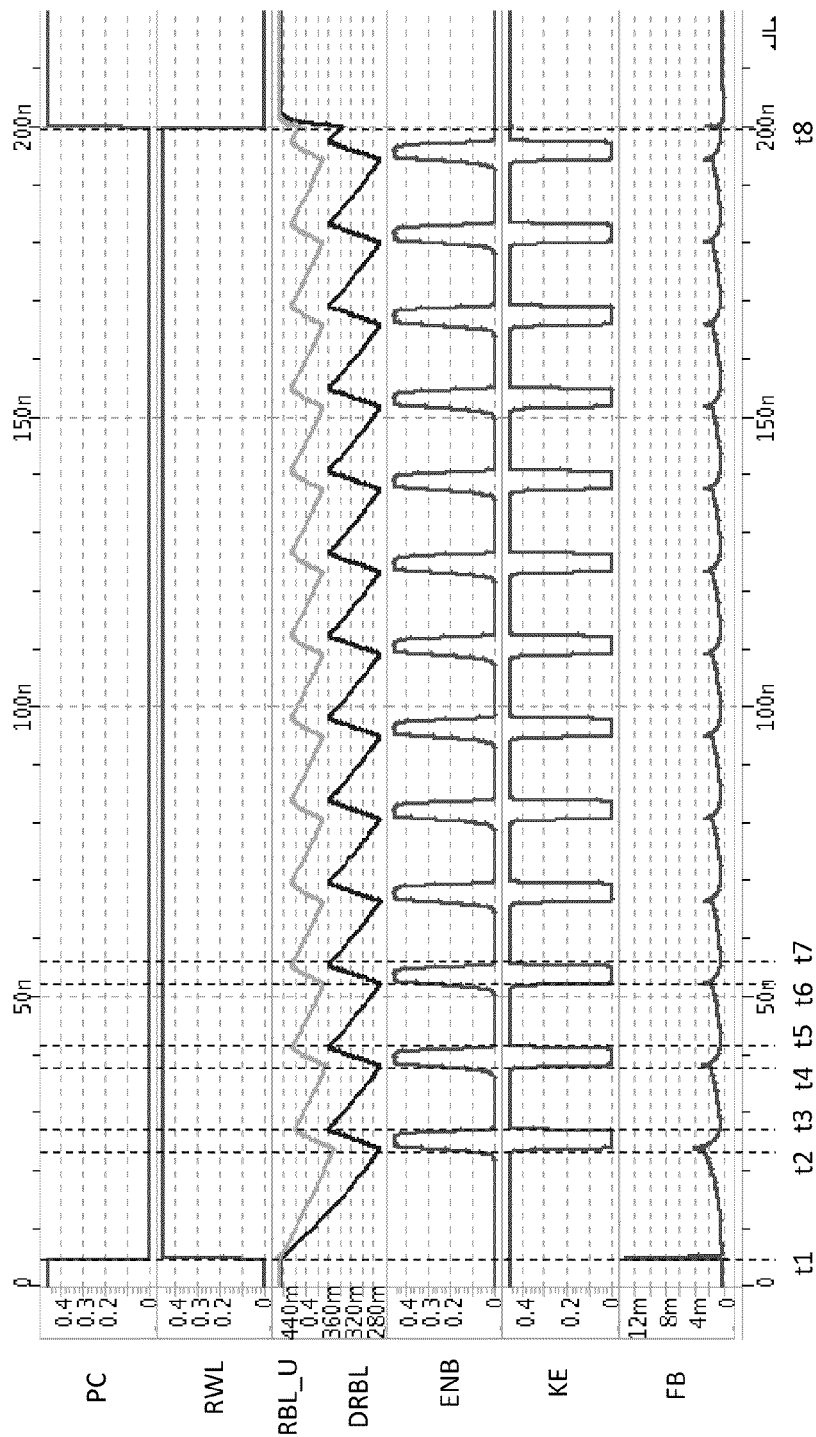
FIG. 3 is a timing diagram of various signals during a read operation performed by a keeper circuit in accordance with the circuit illustrated in FIG. 1A.

The operation of keeper circuit 100A during the reading of a logic one from a bit cell is described with reference to FIGS. 1A, 2, and 3 in which FIG. 2 is a flow diagram of one example of a method 200 of reading a logic one from a bit cell, and FIG. 3 is a timing diagram of a keeper circuit in accordance with FIG. 1A. At block 202 in FIG. 2 and as shown in FIG. 3, the read bit lines, DRBL and RBL_U, are pre-charged to VDD. Read bit lines DRBL and RBL_U are pre-charged to VDD by turning on transistors 114 and 128, respectively, in order to couple DRBL and RBL_U to VDD. With DRBL and RBL_U pre-charged to VDD, inverter 116 outputs a logic zero to node ENB due to the high voltage at node 112. The enable signal, EN, is asserted as a logic high. With ENB being a logic zero and EN being a logic one, the output of logic gate 122, which is the keeper enable signal, EN, is a logic one. A logic one at KE keeps transistor 124 in an off state such that voltage source VDD is not coupled to the source of transistor 126. RBL_D is initially one causing logic gate 130 to output a logic zero to FB.

Keeper circuit 100A begins sensing the voltage of DRBL at block 204 when the read operation commences at block 204. As shown in FIG. 3, the pre-charge voltage goes low and the read word line ("RWL") (not shown) is asserted high at time t1. As a logic one is read out to RBL_U and DRBL, the voltage potential of RBL_U and DRBL begins to drop to leakage current. At time t2 in FIG. 3 and at block 206 in FIG. 2, the voltage at DRBL, which is coupled to node 112, is at a sufficiently low threshold that inverter 116 outputs a logic one node ENB. The output of logic gate 122, which is the voltage at node KE, transitions from a logic one to a logic zero. The logic zero at node KE turns on transistors 120 and 124 from the off state into current-conducting 'on' states.

At block 208, keeper circuit 100 adjusts the voltage on RBL_U to compensate for the leakage current that reduces the voltage of RBL_U in order to maintain RBL_U at a floating high voltage. For example, current flows through transistor 120 such that the voltage of VDD is coupled to the source of transistor 118 resulting in transistor 118 turning on. With transistors 120 and 118 on, current flows through both transistors 118, 120 to node 112 to increase the voltage at node 112 to VDD at time t3. Similarly, current flows through transistor 124 such that the voltage of VDD develops at the source of transistor 126 resulting in transistor 126 turning on. With transistors 124 and 126 on, current flows through both transistors 124, 126 to increase the voltage on RBL_U back to a logic one at time t3. The transition of node 112 to a logic one at time t3 results in inverter changing its output, i.e., node ENB, from logic high to logic low. The output of logic gate 122, i.e., node KE, transitions from a logic zero to a logic one in response to ENB transitioning to a logic low. The logic one at node KE turns off transistor 120, which turns off transistor 118. Similarly, the logic one at node KE turns off transistor 124, which results in transistor 126 turning off.

Thus, the "Keeper enable" turns on when the leakage is large enough to result in an incorrect read operation. The leakage on the dummy RBL_D represents the average leakage with a PVT violation. This method can avoid leakage disturbance in low speed operation or a high leakage corner, and provide better read speed and power performance in high speed or a low leakage corner.

Keeper circuit 100 continues to maintain the floating signals of RBL_U and DRBL at a high voltage by repeatedly turning on an off during the read cycle by repeating steps 204 through 208. For example, the voltages of RBL_U and DRBL drop between times t3 and t4 and are then increased between times t4 and t5 by the operation of keeper circuit 100 as described above with respect to times t2 and t3. At time t5, the voltages of RBL_U and DRBL once again begin to decline due to leakage current until keeper circuit 100 boosts the voltages of RBL_U and DRBL between times t6 and t7.

The read cycle ends at time t8 when RWL transitions from logic one to logic zero and the pre-charge voltage transitions from logic zero to logic one such that RBL_U and DRBL are also logic ones. Node ENB remains as a low logic signal and node KE is maintained at a high logic signal.

Figure 4:
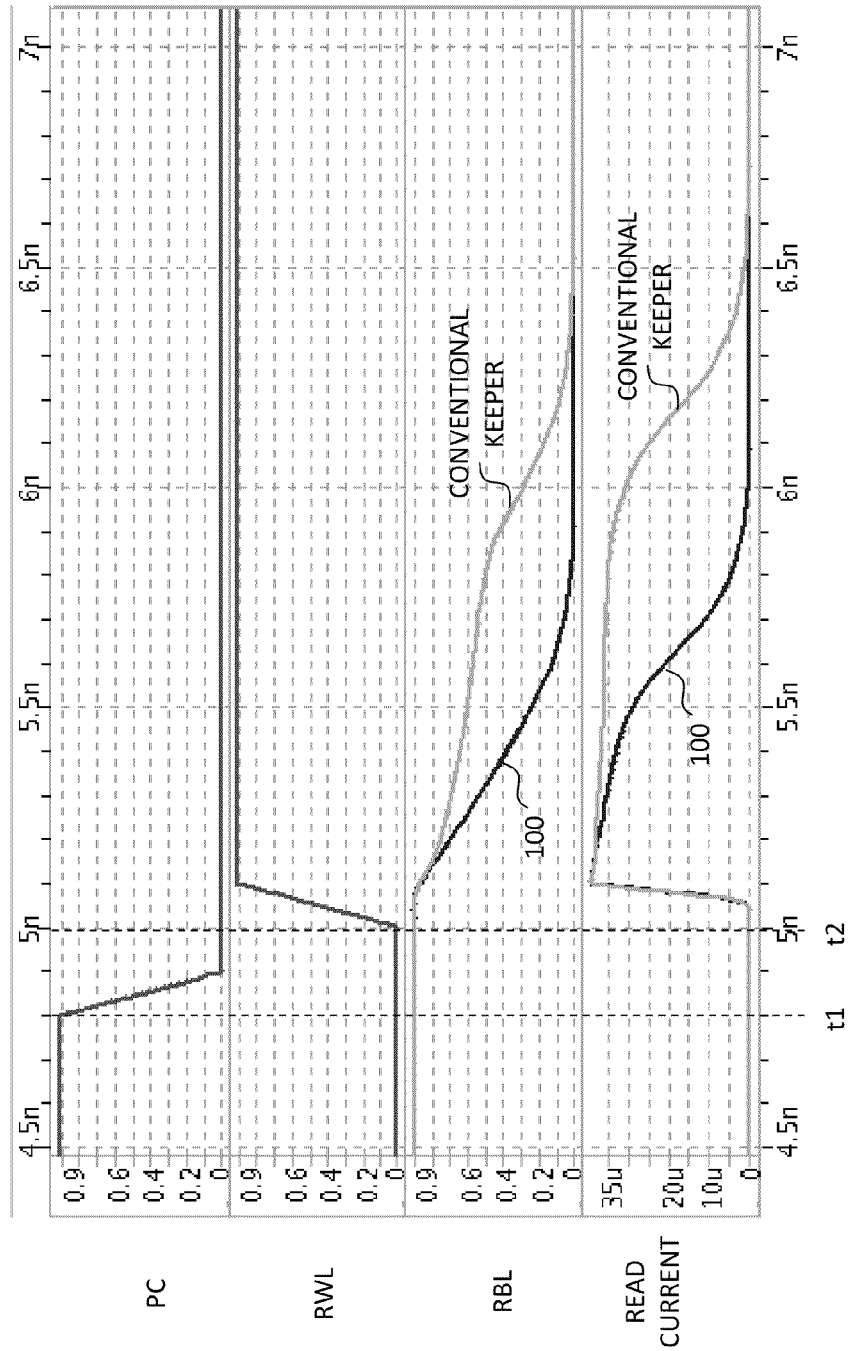
FIG. 4 is a timing diagram of various signals during another read operation performed by a keeper circuit in accordance with the circuit illustrated in FIG. 1A.

In addition to maintaining the floating voltages of RBL_U and DRBL at logic ones during the reading of a logic one from a bit cell, keeper circuit 100 also enables faster reading of a zero from a bit cell. FIG. 4 is a timing diagram of various signals during a read operation in which a logic zero is read from a bit cell coupled to a keeper circuit in accordance with FIG. 1A. Initially, RWL is a logic zero and the pre-charge voltage, PC, is applied such that RBL_U and DRBL are logic ones. At time t1, the reading operation begins as the pre-charge transitions from high to low.

Shortly thereafter at time t2, RWL is asserted and transitions from low to high, and the voltage of RBL begins to transition from a logic high to a logic low when reading the logic zero from a bit cell. As shown in FIG. 4, the RBL in a memory configured with the improved keeper circuit 100 transitions from a logic one to a logic zero faster than the RBL in a conventional keeper, which suffers from DC current fighting in pulling the RBL low. FIG. 4 also provides a graphic comparison of the read current of the improved keeper 100 and a conventional keeper. As shown in FIG. 4, the read current of the improved keeper 100 transitions to zero faster than the read current in a conventional keeper.

The simulations data of FIGS. 3 and 4 were performed based on a keeper having a width of approximately 200 nm and a width of approximately 30 nm. The conventional keeper circuit was implemented with a width of approximately 140 nm and a length of approximately 80 nm for the simulations. The conventional keeper circuit would not properly function for widths below 80 nm due to the DC current overpowering the keeper circuit. In contrast, the improved keeper circuit 100A may advantageously be implemented with a width of less 80 nm such that smaller devices may be implemented. Additionally, the improved keeper circuits disclosed herein provide faster read times by reducing DC current fighting and have lower power consumptions compared to conventional keeper circuits.

The circuits described above provide a smart conditional keeper for single-ended Read SRAM. Through the leakage aware mechanism, the conditional keeper can be adjusted automatically for P.V.T. (Process, Voltage, Temperature) violations. This may provide faster read speed and lower power consumption for single ended SRAM.

In some embodiments, a circuit includes a first circuit configured to sense a leakage of a first bit line and output a first signal in response, and a second circuit configured to receive the first signal output from the first circuit and in response supply current to a second bit line for maintaining a voltage level of the second bit line.

In some embodiments, a method includes sensing a voltage of a first bit line of a semiconductor memory, outputting a first signal from a first circuit that senses the voltage of the first bit line to a second circuit, and adjusting a voltage of a second bit line coupled to the second circuit in response to the first signal. The first signal is based on the voltage of the first bit line and an enable signal received at the first circuit.

In some embodiments, a semiconductor memory includes a leakage detection circuit configured to output a first signal from a first logic gate based on a voltage of a first bit line that is coupled to at least one read port of the semiconductor memory, and an input/output circuit coupled to the leakage detection circuit, the input/output circuit configured to adjust a voltage of a second bit line in response to receiving the first signal from the leakage detection circuit.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A circuit, comprising:
   a first circuit configured to sense a leakage of a first bit line and output a first signal in response; and
   a second circuit configured to receive the first signal output from the first circuit and in response supply current to a second bit line for maintaining a voltage level of the second bit line.

2. The circuit of claim 1, wherein the first circuit includes at least one read port coupled to the first bit line; and
   a latch having a first input coupled to the first bit line, a second input configured to receive an enable signal, and an output configured to output the first signal to the second circuit based on a voltage of the first bit line and the enable signal.

3. The circuit of claim 2, wherein the second circuit includes
   a first transistor having a gate coupled to an output of the latch for receiving the first signal;
   a first logic gate having an input coupled to a second bit line and an output coupled to a gate of a second transistor that is disposed in series with the first transistor; and
   a third transistor having a gate coupled to the output of the first logic gate and a drain coupled to an output bit line.

4. The circuit of claim 2, wherein the latch includes first and second logic gates,
   the first logic gate having a first input coupled to the first bit line and a second input coupled to an output of the second logic gate,
   the second logic gate having a third input coupled to an output of the first logic gate and a fourth input configured to receive the enable signal,
   the output of the second logic gate configured to output the first signal.

5. The circuit of claim 2, wherein the latch includes
   an inverter having an input coupled to the first bit line, and
   a first logic gate having a first input coupled to an output of the inverter, a second input configured to receive the enable signal, and an output for outputting the first signal to the second circuit.

6. The circuit of claim 5, wherein the second circuit includes
   a first transistor having a gate coupled to the output of the second logic gate for receiving the first signal;
   a third logic gate having an input coupled to the second bit line and an output coupled to a gate of a second transistor that is disposed in series with the first transistor; and
   a third transistor having a gate coupled to the output of the first logic gate and a drain coupled to an output bit line.

7. The circuit of claim 6, wherein the first circuit includes a third transistor having a source coupled to a first voltage supply rail, a gate coupled to the output of the first logic gate, and a drain coupled to the first input of the first logic gate through a fourth transistor that is disposed in series with the third transistor.

8. A method, comprising:
   sensing a voltage of a first bit line of a semiconductor memory;
   outputting a first signal from a first circuit that senses the voltage of the first bit line to a second circuit, the first signal based on the voltage of the first bit line and an enable signal received at the first circuit; and
   adjusting a voltage of a second bit line coupled to the second circuit in response to the first signal.

9. The method of claim 8, further comprising:
   pre-charging the first and second bit lines to a first voltage prior to sensing the voltage of the first bit line.

10. The method of claim 8, wherein adjusting the voltage of the second bit line includes increasing the voltage of the second bit line in response to the voltage of the second bit line dropping below a threshold voltage.

11. The method of claim 8, wherein the first signal turns on a transistor in the second circuit thereby coupling the second bit line to a voltage source and increasing the voltage of the second bit line.

12. The method of claim 8, wherein adjusting the voltage of the second bit line includes reducing the voltage of the second bit line to a ground potential.

13. A semiconductor memory, comprising:
    a leakage detection circuit configured to output a first signal from a first logic gate based on a voltage of a first bit line that is coupled to at least one read port of the semiconductor memory; and
    an input/output circuit coupled to the leakage detection circuit, the input/output circuit configured to adjust a voltage of a second bit line in response to receiving the first signal from the leakage detection circuit.

14. The semiconductor memory of claim 13, wherein the input/output circuit includes
    a first transistor having a gate coupled to an output of the first logic gate for receiving the first signal;
    a second logic gate having an input coupled to the second bit line and an output coupled to a gate of a second transistor that is disposed in series with the first transistor; and
    a third transistor having a gate coupled to the output of the second logic gate and a drain coupled to an output bit line.

15. The semiconductor memory of claim 13, wherein the leakage detection circuit includes an inverter having an input coupled to the first read bit line and an output coupled to a first input of the first logic gate.

16. The semiconductor memory of claim 15, wherein the input/output circuit includes
    a first transistor having a gate coupled to an output of the first logic gate for receiving the first signal;
    a second logic gate having an input coupled to the second bit line and an output coupled to a gate of a second transistor that is disposed in series with the first transistor; and
    a third transistor having a gate coupled to the output of the first logic gate and a drain coupled to an output bit line.

17. The semiconductor memory of claim 16, wherein the leakage detection circuit includes a fourth transistor having a source coupled to a first voltage supply rail, a gate coupled to the output of the first logic gate, and a drain coupled to the input of the inverter through a fifth transistor that is disposed in series with the fourth transistor.

18. The semiconductor memory of claim 13, wherein the leakage detection circuit includes a second logic gate having a first input coupled to the first bit line, a second input coupled to an output of the first logic gate, and an output coupled to a third input of the first logic gate, a fourth input of the first logic gate configured to receive an enable signal, and an output of the first logic gate configured to output the first signal to the input/output circuit.

19. The semiconductor memory of claim 13, wherein the first bit line is a detection read bit line.

20. The semiconductor memory of claim 13, wherein the semiconductor memory is a static random access memory, and the at least one read bit port is a single-ended read bit port of the semiconductor memory.

* * * * *